United States Patent
Notani et al.

(10) Patent No.: US 10,402,121 B2
(45) Date of Patent: Sep. 3, 2019

(54) SYSTEMS AND METHODS FOR REDUCING PERFORMANCE STATE CHANGE LATENCY

(71) Applicant: Apple Inc., Cupertino, CA (US)

(72) Inventors: Rakesh L. Notani, Sunnyvale, CA (US); Robert E. Jeter, Santa Clara, CA (US)

(73) Assignee: Apple Inc., Cupertino, CA (US)

(*) Notice: Subject to any disclaimer, the term of this patent is extended or adjusted under 35 U.S.C. 154(b) by 57 days.

(21) Appl. No.: 15/849,945

(22) Filed: Dec. 21, 2017

(65) Prior Publication Data

US 2019/0196740 A1    Jun. 27, 2019

(51) Int. Cl.
G06F 3/06 (2006.01)

(52) U.S. Cl.
CPC .......... *G06F 3/0659* (2013.01); *G06F 3/0611* (2013.01); *G06F 3/0683* (2013.01)

(58) Field of Classification Search
CPC ...... G06F 11/3058; G06F 3/06; G06F 3/0659; G06F 3/0611; G06F 3/0683; G06F 3/0625; G06F 3/0604; G06F 3/0673; G06F 3/0656; G06F 3/0653; G06F 13/1689; G06F 3/0634; G06F 1/324; G06F 1/20; G06F 1/206; G06F 1/08; G06F 13/424; G11C 8/18
USPC ....................................... 711/154
See application file for complete search history.

(56) References Cited

U.S. PATENT DOCUMENTS

| | | | | |
|---|---|---|---|---|
| 6,442,700 B1* | 8/2002 | Cooper | ........... | G06F 1/206 713/320 |
| 6,457,135 B1* | 9/2002 | Cooper | ........... | G06F 1/14 713/323 |
| 6,823,516 B1* | 11/2004 | Cooper | ........... | G06F 1/3203 718/104 |
| 7,711,864 B2* | 5/2010 | de Cesare | ........... | G06F 1/324 710/8 |
| 8,645,617 B2 | 2/2014 | Shaeffer | | |
| 8,880,752 B2* | 11/2014 | Hess | ........... | G06F 13/385 710/11 |
| 8,937,846 B2* | 1/2015 | Duffner | ........... | G11C 7/00 365/189.16 |
| 9,043,633 B2 | 5/2015 | Ware | | |
| 9,323,538 B1* | 4/2016 | Blunno | ........... | G06F 9/44 |
| 9,362,902 B2 | 6/2016 | Snook | | |
| 9,396,778 B1* | 7/2016 | Jeter | ........... | G11C 7/00 |
| 2011/0239030 A1* | 9/2011 | Ware | ........... | G11C 7/04 713/400 |
| 2012/0110400 A1 | 5/2012 | Manohararajah | | |

(Continued)

*Primary Examiner* — Shawn X Gu
*Assistant Examiner* — Jean C Edouard
(74) *Attorney, Agent, or Firm* — Meyertons, Hood, Kivlin, Kowert & Goetzel, P.C.

(57) ABSTRACT

A method and apparatus for performing performance state changes are disclosed. A power management circuit may be configured to receive requests for changes to first and second performance states for at least at least one memory of a plurality of memories. In response to a determination that a change to the first performance state is in progress, when the request to change to the second performance state is received, the power management controller may send a notification to a controller coupled to the memories. The controller may halt scheduling of memory interface calibration operations for the at least one memory based on the notification.

20 Claims, 10 Drawing Sheets

(56) References Cited

U.S. PATENT DOCUMENTS

| | | | |
|---|---|---|---|
| 2012/0159230 A1* | 6/2012 | Chen | G06F 1/08 |
| | | | 713/600 |
| 2013/0064025 A1* | 3/2013 | Chen | G06F 13/1689 |
| | | | 365/193 |
| 2013/0198452 A1* | 8/2013 | Chen | G11C 16/349 |
| | | | 711/114 |
| 2014/0359196 A1* | 12/2014 | Ragland | G06F 3/0634 |
| | | | 711/102 |

* cited by examiner

SYSTEMS AND METHODS FOR REDUCING PERFORMANCE STATE CHANGE LATENCY

BACKGROUND

Technical Field

The embodiments described herein generally relate to performance state control in an integrated circuit, specifically reducing latency of performance state changes.

Description of the Relevant Art

Integrated circuits may include multiple circuit blocks designed to perform various functions. For example, an integrated circuit may include a memory circuit block configured to store multiple program instructions, and a processor or processor core configured to retrieve the program instructions from the memory, and execute the retrieved instructions In some integrated circuits, the performance of such circuit blocks may be adjusted based on demands of the system. For example, certain tasks require increased processor capability, higher bandwidth from memories, and the like. To adjust the performance of a particular circuit block, a voltage level of a power supply for the particular circuit block may be adjusted. Alternatively, or additionally, a frequency of a clock signal for the particular circuit block may be modified.

When a performance state is changed for a particular circuit block, operating parameters of some sub-circuits included in the particular circuit block may be adjusted. For example, in some memory circuit blocks, interface circuits that allow the memory circuit blocks to send and receive data via a communication bus may be recalibrated in response to changes in the performance state of the memory blocks.

SUMMARY OF THE EMBODIMENTS

Various embodiments of a computer system are disclosed. Broadly speaking, an apparatus and a method are contemplated, in which a controller is coupled to a plurality of memories. A power management circuit may be configured to receive a request for a change to a first performance state for at least at least one memory of the plurality of memories, and receive, at a later time, a request for a change to second performance state for the at least one memory. The power management controller may be further configured to send a notification to the controller in response a determination that the change to the first performance state is in progress. The power management circuit may be further configured to execute the change to the second performance state upon completion of the change to the first performance state, and the controller may be configured to halt scheduling of memory interface calibration operations for the at least one memory based on the notification.

In one embodiment, the power management circuit may be further configured to, in response to a determination that the change to the first performance state has not started, and that a supply voltage value of the first performance state is the same as the supply voltage value of the second performance state, merge the first performance state and the second performance state into a third performance state, and execute a change to the third performance state.

In another non-limiting embodiment, the power management circuit may be further configured to, in response to a determination that the change to the first performance state is in progress, and that a supply voltage of the first performance state is the same as a supply voltage of the second performance state, serially execute the change to the first performance state and the change to the second performance state.

These and other embodiments will become apparent upon reference to the following description and accompanying drawings.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

DETAILED DESCRIPTION OF EMBODIMENTS

In computer systems, some circuit blocks may require period calibration to account for changes in the operating conditions of the computer system. For example, changes to a voltage level of a power supply coupled to a memory circuit may affect performance of interface circuits included in the memory circuit. In response to such a change in the voltage level of the power supply, an interface circuit in the memory circuit may be scheduled to perform a calibration operation.

Circuit blocks in a computer system may also operate according to difference performance states. As used and described herein, a performance state refers to a collection of operating parameters for a given circuit block that affect the performance of the circuit block. For example, a given performance state may include particular values for a power supply voltage level, a frequency of a block signal, and the like. Performance states may be change for various circuit blocks to manage power and performance of a computer system.

If a memory circuit is performing a calibration operation, the memory circuit may be unable to comply with a change in performance state, resulting in a delay to implement the desired change in performance state. Such latencies in implementing a requested change in performance state may decrease performance of a computer system. The embodiments illustrated in the drawings and describe herein may provide techniques for changing performance states, while reducing latency between the changes in performance states.

Figure 1:
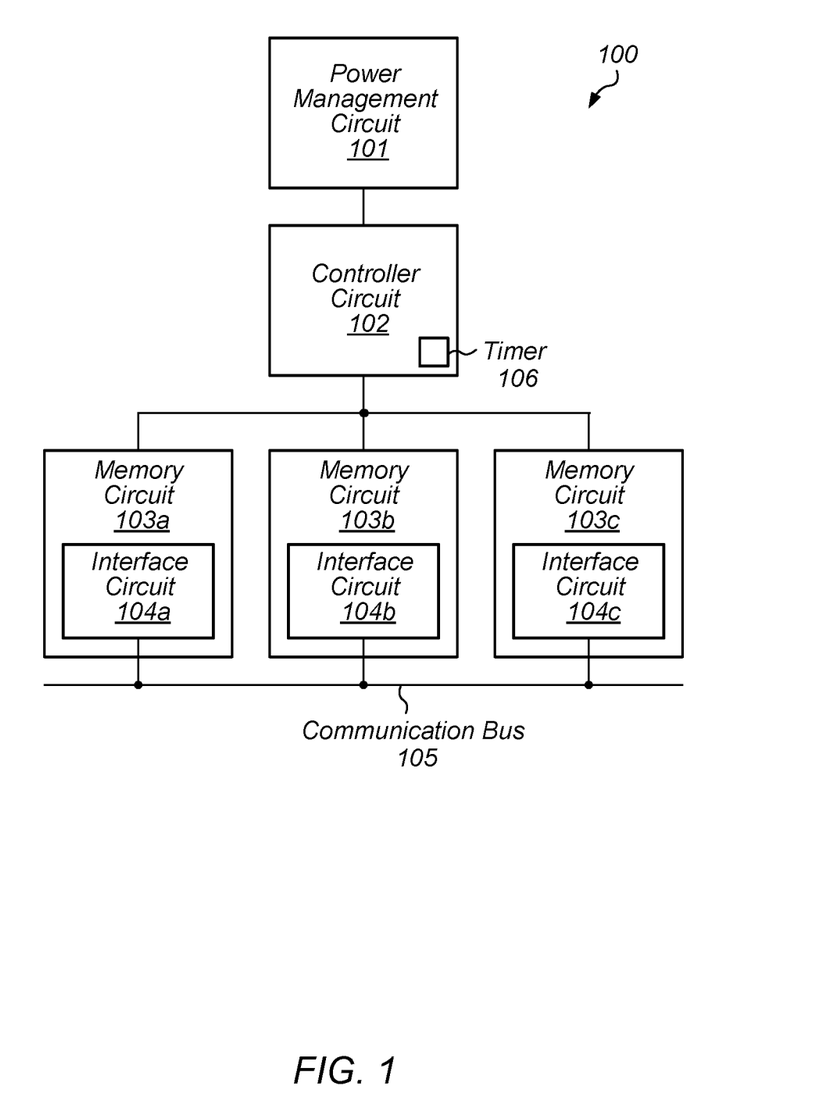
FIG. 1 illustrates a block diagram of a computer system.

A block diagram of an embodiment of a computer system is illustrated in FIG. 1. In the illustrated embodiment, computer system 100 includes power management circuit 101, controller circuit 102, and memory circuits 103a, 103b, and 103c. Memory circuit 103a includes interface circuit 104a, memory circuit 103b includes interface circuit 104b, and memory circuit 103c includes interface circuit 104c. Each of interface circuits 104a through 104c is coupled to communication bus 105. In various embodiments, computer system 100 may be configured for use in a desktop computer, server, or in a mobile computing application such as, e.g., a tablet, laptop computer, or wearable computing device.

Power management circuit 101 is configured to receive a request for a change to a first performance state for at least one of memory circuits 103a-c. Additionally, power management circuit 101 is configured to receive a request for a change to a second performance state for the at least one of memory circuit 103a-c, wherein the request for the change to the second performance state is received at a later time than the request for the change to the first performance state. In various embodiments, the requests for changes to different performance states may be generated by a software or program application, or may be based upon a change in the operating conditions of computer system 100.

When the request for the change to the second performance state is received, power management circuit 101 may check a status of the change to the first performance state. In response to a determination that the change to the first performance state is in progress, power management circuit 101 is configured to send a notification to controller circuit 102. In various embodiments, the notification may be sent using a dedicated signal wire or wires, or may be send via a communication network internal to computer system 100. In other embodiments, power management circuit 101 may send different notifications to controller circuit 102 based on a comparison of parameters included in the first performance state and the second performance state. Power management circuit 101 may also send a notification to controller circuit 102 in response to a determination that the change to first performance state has not started.

In some embodiments, power management circuit 101 may be configured to merge the first performance state and the second performance state into a third performance state, in response to a determination that the change to the first performance state has not started. Once the two performance states have been merged into the third performance state, power management circuit 101 may execute a change to the third performance state. Power management circuit 101 may, in other embodiments, be configured to serially execute the change to the first performance state and the second performance state in response to a determination that the change to the first performance state is in progress and that supply voltage values for the first performance state and the second performance state are the same.

In various embodiments, power management circuit 101 may include any suitable combination of logic gates, latch circuits, flip-flop circuits, sequential logic circuits, and the like. Power management circuit 101 may, in some embodiments, include a general-purpose processor configured to execute program instructions. In some embodiments, power management circuit 101 may be configured to send notifications or other control signals to controller circuit 102, voltage regulator circuits (not shown), and clock generation circuits (also not shown).

Upon receiving a notification from power management circuit 101, controller circuit 102 may perform various tasks. In some embodiments, controller circuit 102 may halt scheduling of calibration operations for interface circuits 104a-c. Controller circuit 102 may, in other embodiments, check for changes in power supply voltage levels or clock frequencies for memory circuits 103a-c during changes in internal state of the controller circuit 102. In response to such changes in power supply voltage levels or clock frequencies, controller circuit 102 may abort reference voltage calibration operations in interface circuits 104a-c.

In some embodiments, controller circuit 102 may start timer 106 in response to a change from a particular performance state to another performance state. If there is a return the particular performance state before timer 106 expires, controller circuit 102 may send a message to at least one of memory circuits 103a-c indicating that interface circuits 104a-c should use previously generated calibration results.

In various embodiments, controller circuit 102 may also halt the scheduling of calibration results in response to determining that a change in a voltage level of a power supply for memory circuits 103a-c is a temperature-based change.

Controller circuit 102 may include any suitable combination of logic gates, latch circuits, flip-flop circuits, sequential logic circuits, and the like. In some embodiments, controller circuit 102 may include a general-purpose processor configured to execute program instructions.

Memory circuits 103a-c may include any suitable type of memory such as a Dynamic Random-Access Memory (DRAM), a Static Random-Access Memory (SRAM), a Read-only Memory (ROM), Electrically Erasable Programmable Read-only Memory (EEPROM), or a non-volatile memory, for example. It is noted that in the embodiment of an computer system in FIG. 1, three memory circuits are depicted. In other embodiments, any suitable number of memory circuits may be employed.

Interface circuits 104a-c may be configured to implement any suitable type of communication protocol employed on communication bus 105. For example, in some embodiments, interface circuits 104a-c may be configured to implement a double data rate (DDR) communication protocol. Interface circuits 104a-c may include mixed-signal or analog circuits, and may be configured to perform calibration operations in response to a notification or other request from controller circuit 102. Such calibration operations may include adjusting reference voltage and/or sample points of data received via communication bus 105. Results from a calibration operation may be saved by interface circuits 104a-c, for use at a later time.

It is noted that the embodiment illustrated in FIG. 1 is merely an example. In other embodiments, computer system 100 may includes different circuit blocks and different arrangements of circuit blocks.

Figure 2:
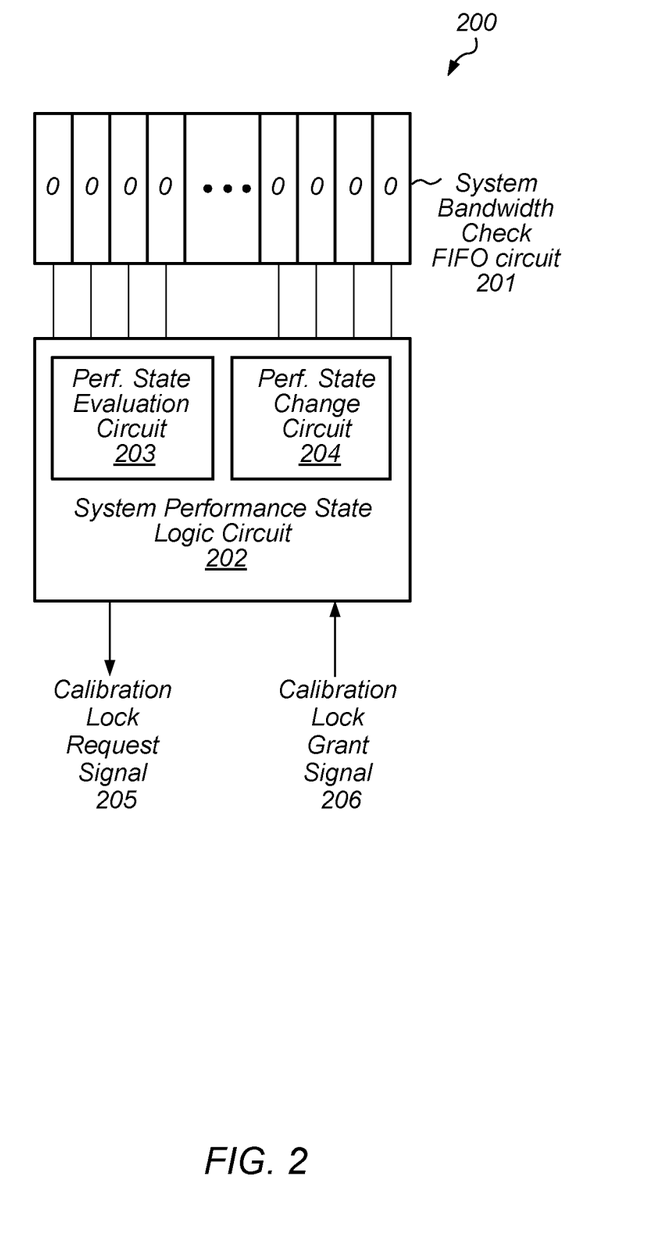
FIG. 2 illustrates a block diagram of calibration lock system.

In some cases, a software-based request for a performance state change may occur shortly after a calibration operation has begun. In such situations, the execution of the performance state change may be delayed. For example, in some systems, a delay of 1 millisecond or more may be experienced. To reduce the delay in executing the requested change in performance state, a calibration lock may be requested by a software program. An embodiment of a calibration lock system is illustrated in FIG. 2.

Calibration lock system 200 includes system bandwidth first-in first-out (FIFO) circuit 201, and system performance state logic circuit 202. In various embodiments, system bandwidth FIFO circuit 201 and system performance state logic circuit 202 may be included in controller circuit 102, power management circuit 101, or any other suitable location.

System bandwidth FIFO circuit 201 is configured to store a series of data bits indicating a state of calibration operations being performed on memory circuits, such as, memory circuits 103a-c, for example. One logic value of a particular data bit may indicate that a calibration operation is being performed on a corresponding memory circuit, and another logic value of the particular data bit may indicate that the corresponding memory circuit is not performing a calibration operation.

In various embodiments, system bandwidth FIFO circuit 201 may include multiple data storage circuits arranged as a FIFO circuit, register file, or other suitable circuit arrangement. Each data storage circuit may be configured to store a respective data bit, and may include multiple ports for reading and writing the data storage circuit.

System performance state logic circuit 202 includes performance state evaluation circuit 203 and performance state change circuit 204. During operation, performance state evaluation circuit 203 may issue calibration lock request signal 205 in response to a lock request from a software or application program.

In response to calibration lock request signal 205, a controller, such as, e.g., controller circuit 102, may halt scheduling of calibration operations, and send calibration lock grant signal 206 to system performance state logic circuit 202. Once the calibration lock grant signal 206 has been received, performance state evaluation circuit 203 may check the status of calibration operations being performed using data stored in system bandwidth FIFO circuit 201. Once all calibration operations have completed, performance state change circuit 204 may change the performance state to the requested performance state, and which point the calibration lock may be released, allowing calibration operations to be scheduled.

Performance state evaluation circuit 203 and performance state change circuit 204 may include any suitable combination of logic gates, latch circuits, flip-flop circuits, sequential logic circuits, and the like. In some embodiments, either one or both of performance state evaluation circuit 203 and performance state change circuit 204 may be implemented as a general-purpose processor configured to execute program instructions.

It is noted that the embodiment depicted in FIG. 2 is merely an example. In other embodiments, different circuit blocks and different arrangements of circuit blocks are possible and contemplated.

Figure 3:
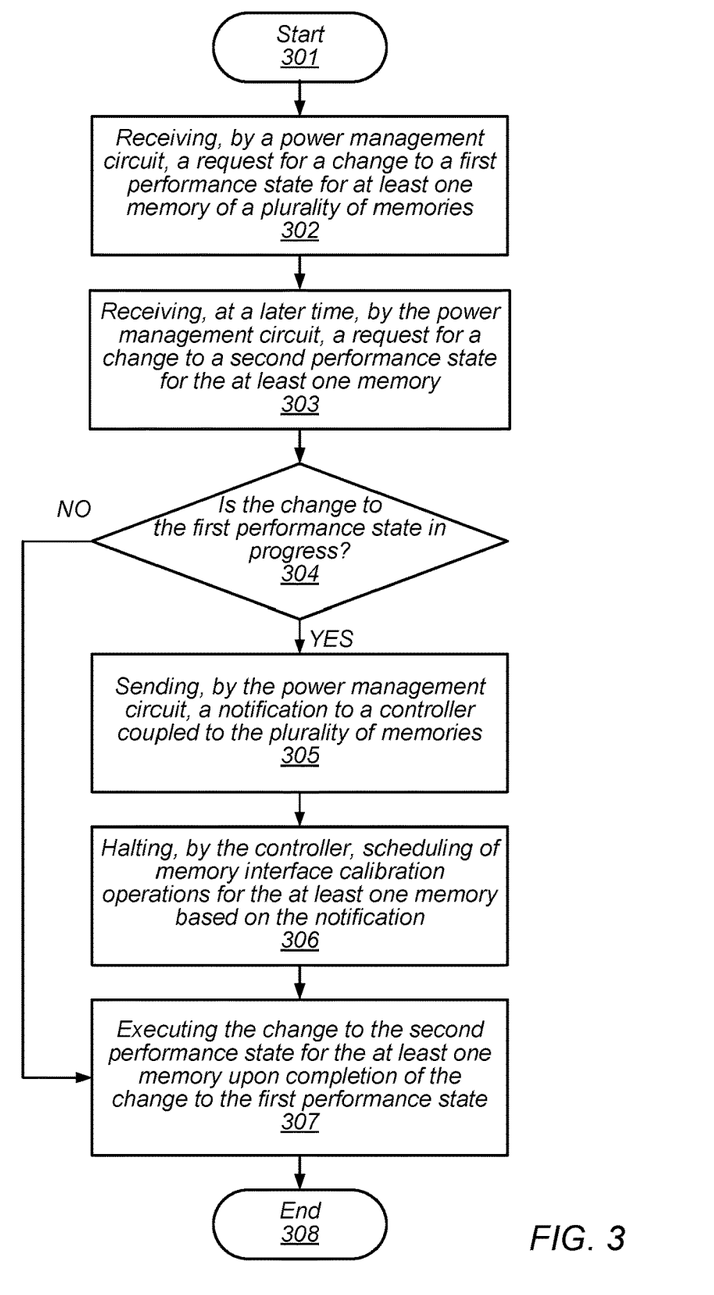
FIG. 3 illustrates flow diagram depicting an embodiment of a method for performing a performance state change.

A flow diagram depicting an embodiment of a method for making a performance state change is illustrated in FIG. 3. The method begins in block 301. A power management circuit, such as, e.g., power management circuit 101, may then receive a request for a change to a first performance state for at least one memory of a plurality of memories (block 302). In various embodiments, the request may result from a change in operating conditions, a software request, or any other suitable reasons.

At a later time, a request for a change to a second performance state for the at least one memory may be received by the power management circuit (block 303). The method may then depend on a status of the change to the first performance state (block 304).

If the change to the first performance state is in progress, then the power management circuit may send a notification to a controller, such as, e.g., controller circuit 102, coupled to the plurality of memories (block 305). In various embodiments, the power management circuit may use a dedicated signal wire or bus to send the notification. In other embodiments, the power management circuit may send the notification using a communication bus coupled to multiple circuit blocks, including the power management circuit and the controller that employs a particular communication protocol.

The controller may then halt scheduling of memory interface calibration operations for the at least one memory based on the notification (block 306). In various embodiments, the controller may track changes in operating conditions of the plurality of memories, and schedule calibration operations for interface circuits included in the memories based on such changes in operating conditions. Upon receiving the notification from the power management circuit, the controller halts further scheduling of calibration operations even though conditions may warrant such calibration operations. By halting the scheduling of calibration operations, a latency associated with changing performance states may be reduced. It is noted that, in various embodiments, the controller may resume scheduling calibration operations once the change to the second performance state has been executed.

Once the controller has halted further scheduling of calibration operations, the power management circuit may execute the second performance state change upon completion of the change to the first performance state (block 307). The method may conclude in block 308.

Returning to block 304, if the change to the first performance state is not in progress, the method may proceed from block 307 as described above. It is noted that the embodiment of the method illustrated in the flow diagram of FIG. 3 is merely an example. In other embodiments, different operations may be employed.

Figure 4:
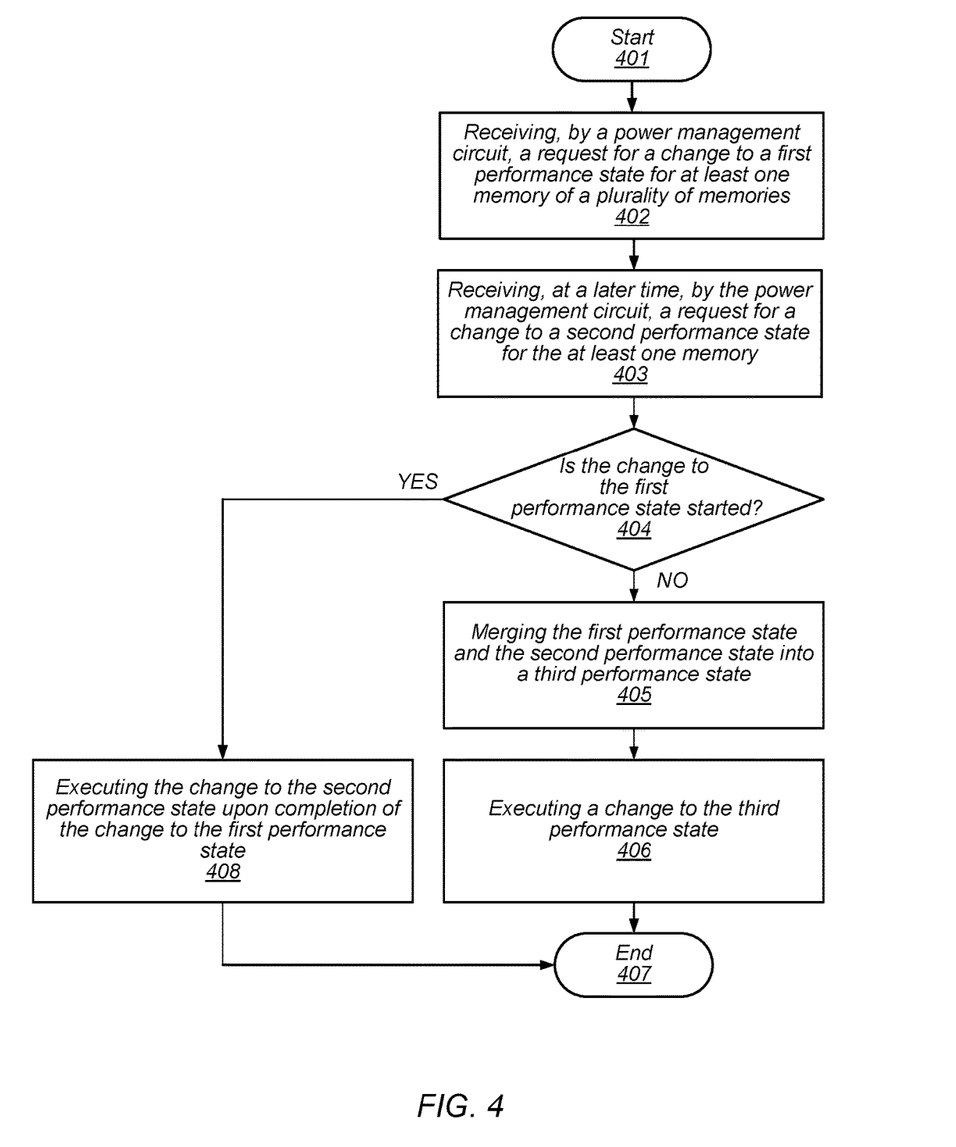
FIG. 4 illustrates a flow diagram depicting an embodiment of another method for performing a performance state change.

In some cases, when multiple performance state changes are requested, it may be possible to merge the requests into a single performance state change, thereby saving delay due to calibration operations that would normally be performed between the changes in performance state. A flow diagram depicting an embodiment of handling multiple performance state changes is illustrated. The method begins in block 401.

A power management circuit, such as, e.g., power management circuit 101, may then receive a request for a change to a first performance state for at least one memory of a plurality of memories (block 402). In various embodiments, the request for a change in the performance state may be in response to a software request, a change in operating conditions of the computer system, or any other suitable reason. At a later time, the power management circuit may then receive a request to change to a second performance state for the at least one memory (block 403). The method then depends on the status of the change to the first performance state (block 404).

If the change to the first performance state has already started, then the changed to the second performance state will be executed upon completion of the change to the first performance state (block 408). Once the change to the second performance state has been executed, the method may conclude in block 407.

Alternatively, if the change to the first performance state has not yet started, then the first performance state and the second performance state are merged into at third performance state (block 405). In various embodiments, values for power supply voltages, and clock frequencies may be determined for the third performance state as through the first performance state had been executed, followed by the change to the second performance state. A change to the third performance state is then executed (block 406). Once the change to the third performance state has been executed, the method may conclude in block 407.

It is noted that the embodiment of the method illustrated in the flow diagram of FIG. 4 is merely an example. In other embodiments, different operations and different orders of operations are possible and contemplated.

Figure 5:
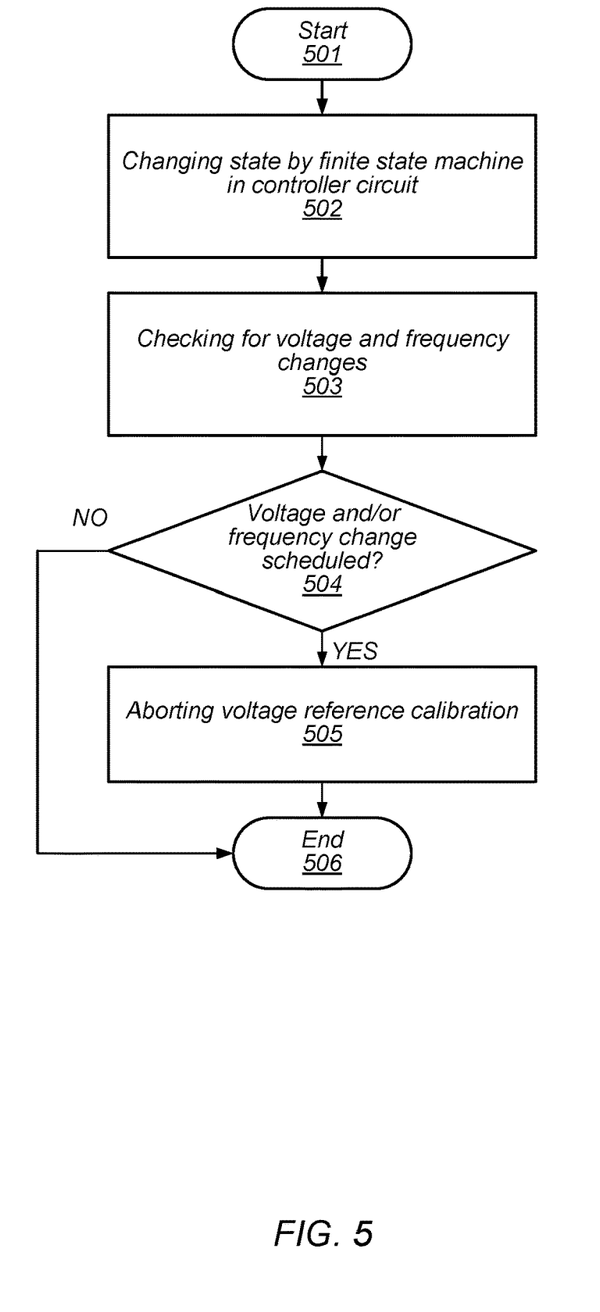
FIG. 5 illustrates a flow diagram depicting an embodiment of a method for aborting voltage reference calibrations.

Turning to FIG. 5, a flow diagram depicting an embodiment of a method for reducing a latency penalty associated with voltage reference calibration. The method begins in block 501.

A finite state machine included in a controller circuit, such as, e.g., controller circuit 102, may then change state (block 502). In various embodiments, a finite state machine may transition through various states in response to different stimuli. For example, a finite state machine may transition from one state to another in response to completion of a particular task, after a given time period has elapsed, or any other suitable condition.

The controller circuit may then check for voltage or frequency changes (block 503). In some embodiments, the controller circuit may receive information from a power management circuit, such as, e.g., power management circuit 101, that indicates changes in the performance state of memories coupled to the controller circuit. Such performance state changes may include changes in a voltage level of a power supply for the memories (a "voltage change") or changes in frequency of clock signals used by the memories (a "frequency change"). The method may then depend on whether a voltage and/or frequency change is scheduled (block 504).

If there are no voltage or frequency changes scheduled, the method may conclude in block 506. Alternatively, if there are voltage or frequency changes scheduled, voltage reference calibrations may be aborted (block 505). In some cases, the controller may send a signal to the memories to abort any scheduled voltage reference calibrations. By aborting voltage reference calibrations, a memory may avoid spending time to calibrate a voltage reference, only to have to repeat the process later, thereby reducing latency to access the memory after a performance state change. Once the voltage reference calibrations have been aborted, the method may conclude in block 505.

It is noted that the embodiment of the method depicted in the flow diagram of FIG. 5 is merely an example. In other embodiments, different operations and different orders of operations may be employed.

Figure 6:
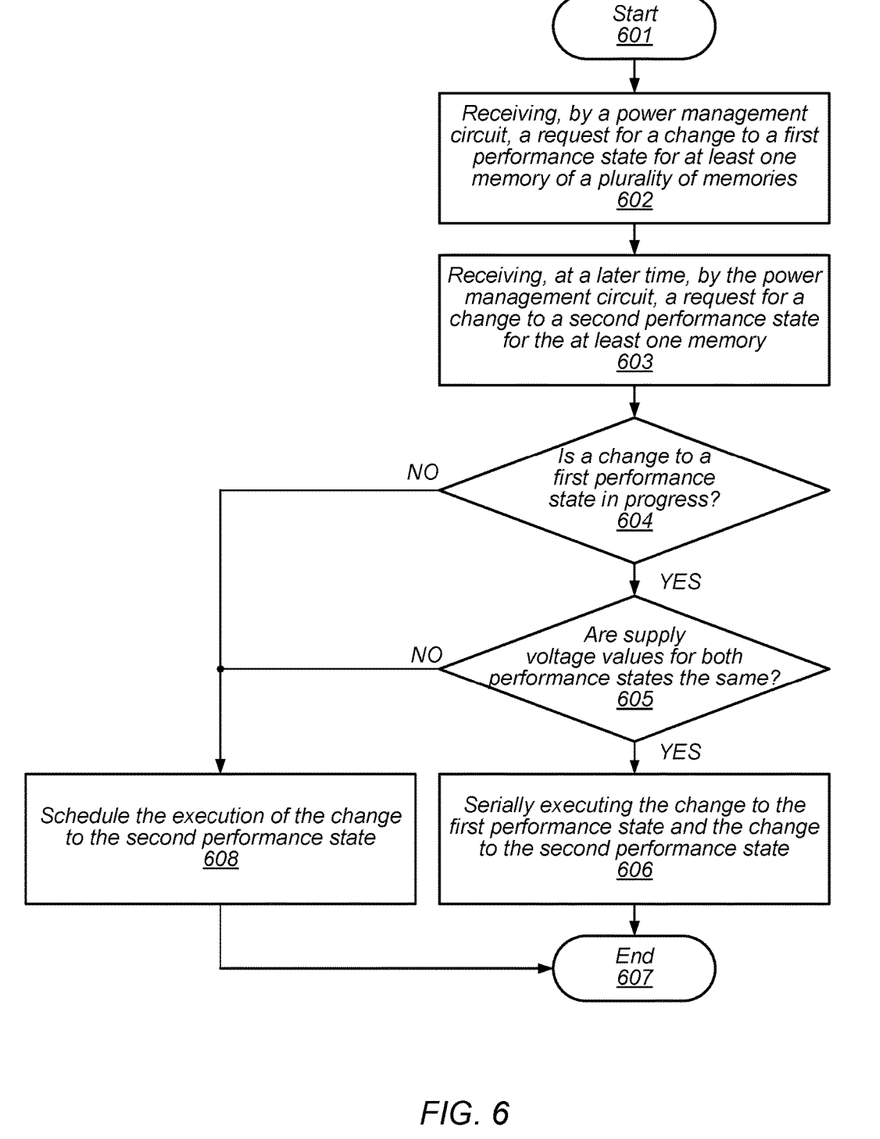
FIG. 6 illustrates a flow diagram depicting an embodiment of a particular method for performing a performance state change.

In some cases, a request to change the performance state of a memory may be received while another performance state change is in progress. An embodiment of a method for performing multiple performance state changes is illustrated in FIG. 6. The method begins in block 601.

A power management circuit, such as, e.g., power management circuit 101, may receive a request for a change to a first performance state for at least one memory of a plurality of memories (block 602). At a later time, a request for a change to a second performance state for the at least one memory may be received by the power management circuit (block 603). The method may then depend on a status of a voltage change included in the first performance state (block 604). It is noted that a frequency change included in the first performance change may already be in progress at the time the status of the voltage change is checked.

If the voltage change included in the first performance state in progress, the execution of the change the second performance state is scheduled (block 608). In various embodiments, the power management circuit may schedule the change to the second performance state according to any suitable algorithm. Once the change to the second performance state has been scheduled, the method may conclude in block 607.

If the voltage change included the first performance state in progress, the method may then depend on whether the voltage values for both performance states are the same (block 605). If the value of the supply voltage for the first performance state is not the same as the voltage value for the second performance state, the method may continue from block 608 as described above. Alternatively, if the value of the supply voltage for the first performance state is the same as the value for the second performance state, the change to first performance state and the change to the second performance state are serially executed (block 606). By executing the two performance state changes in a serial fashion, time lost due to calibration operations performed between the two performance state changes may be reduced. Once the two performance state changes have been serially executed, the method concludes in block 607.

The embodiment of the method illustrated in FIG. 6 is merely an example. In other embodiments, different orders of operations are possible and contemplated.

Figure 7:
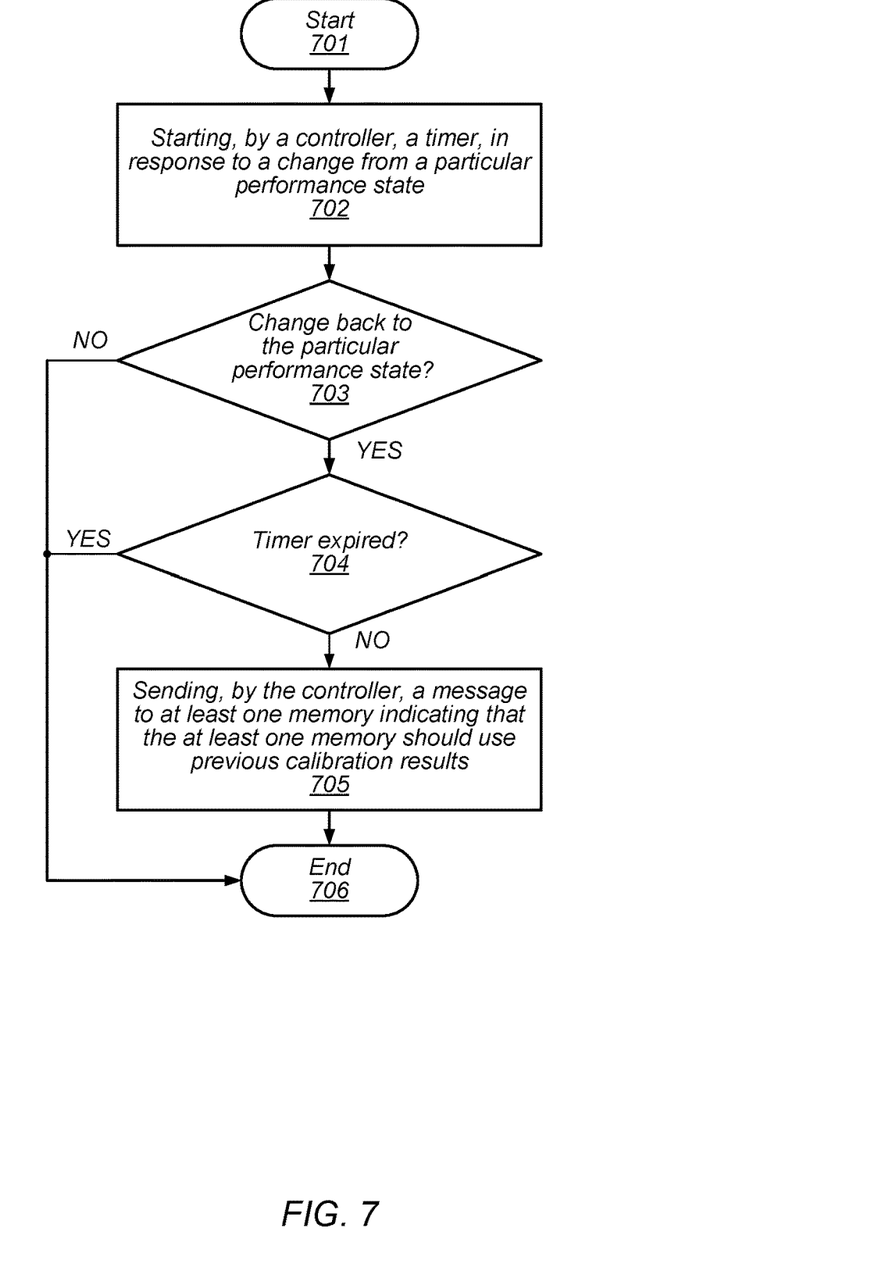
FIG. 7 illustrates a flow diagram depicting an embodiment of a method reusing calibration results during a performance state change.

Turning to FIG. 7, a flow diagram depicting an embodiment of a method for reusing calibration results during performance state changes is illustrated. The method begins in block 701.

A timer is then started by a controller is response a change from a particular performance state (block 702). In various embodiments, the controller may include a timer circuit used to track a given period of time. Such a timer may be implemented using one of various design styles. The method may then depend on whether this is a change back to the particular performance state (block 703).

If there is not change back to the particular performance state, the method may conclude in block 706. If, however there is a change back the particular performance state, the method may then depend on a value of the timer (block 704). If the timer has expired, then the method may conclude in block 706.

Alternatively, if the timer has not expired, the controller may send a message to at least one memory indicating that the at least one memory should use previous calibration results (block 705). By using previous calibration results, a latency resulting from the at least one memory switching in and out of the particular performance state may be eliminated. With the sending of the message, the method may conclude in block 706.

It is noted that the embodiment of the method depicted in the flow diagram of FIG. 7 is merely an example. In other embodiments, different operations and different orders of operations are possible and contemplated.

In some computer systems, environmental conditions may be monitored and operating parameters may be adjusted based on changes in the environmental conditions. For example, in some computer systems, voltage levels of one or more power supply signals may be adjusted based on the temperature of the computer system. Such changes in the voltage levels of the power supply signals may, in various embodiments, be less than changes in the voltage level of the power supply signals due to performance state changes.

Figure 8:
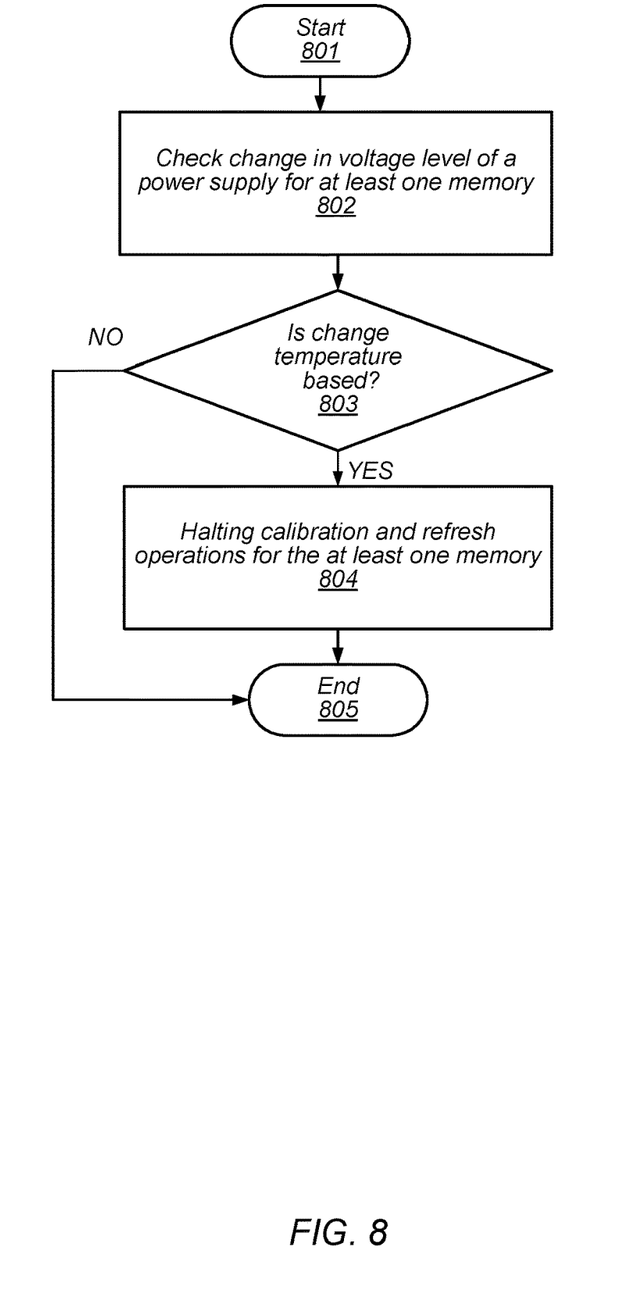
FIG. 8 illustrates a flow diagram depicting an embodiment of a method for halting calibration and refresh operations during a temperature-based power supply voltage change.

Since the changes in the voltage levels of the power supply signals resulting from temperature-based adjustments are less than changes resulting from performance state changes, certain calibration and refresh operations typically required after a power supply signal voltage level change may be halted to reduce latency and improve performance. A flow diagram depicting an embodiment of a method for halting calibration and refresh operations is illustrated in FIG. 8. The method begins in block 801.

A change in the voltage level of a power supply for at least one memory may then be checked (block 802). In various embodiments, a power management circuit, such as, e.g., power management circuit 101 as illustrated in FIG. 1, may generate one or more signals indicating a source for voltage level changes of a power supply signal. A controller coupled to the at least one memory may receive such signals or other information. The method may then depend on a reason for the voltage change of the power supply signal (block 803).

If the change in the voltage level of the power supply signal is not temperature-based, then the method may conclude in block 805. Alternatively, if the change in the voltage level of the power supply signal is temperature-based, then the controller may halt calibration and refresh operations for the at least one memory (block 804). In various embodiments, the controller may include a state machine or other sequential logic circuit, and may skip one or more states that generate the control signals for the at least one memory used to perform calibration operations on the memory interface. Additionally, or alternatively, the state machine or sequential logic circuit may skip states that generate control signals that trigger a refresh operation in the at least one memory. The method may then conclude in block 805.

It is noted that the embodiment of the method illustrated in FIG. 8 is merely an example. In other embodiments, different operations and different orders of operations are possible and contemplated.

In some cases, a performance state change may be a result of a software request. If the request is received shortly following the start of a calibration operation, a delay in implemented the performance state change may result. To remediate such a delay, a calibration lock may be employed. An embodiment of a method for implementing such a calibration lock is depicted in the flow diagram of FIG. 9. The method begins in block 901.

Figure 9:
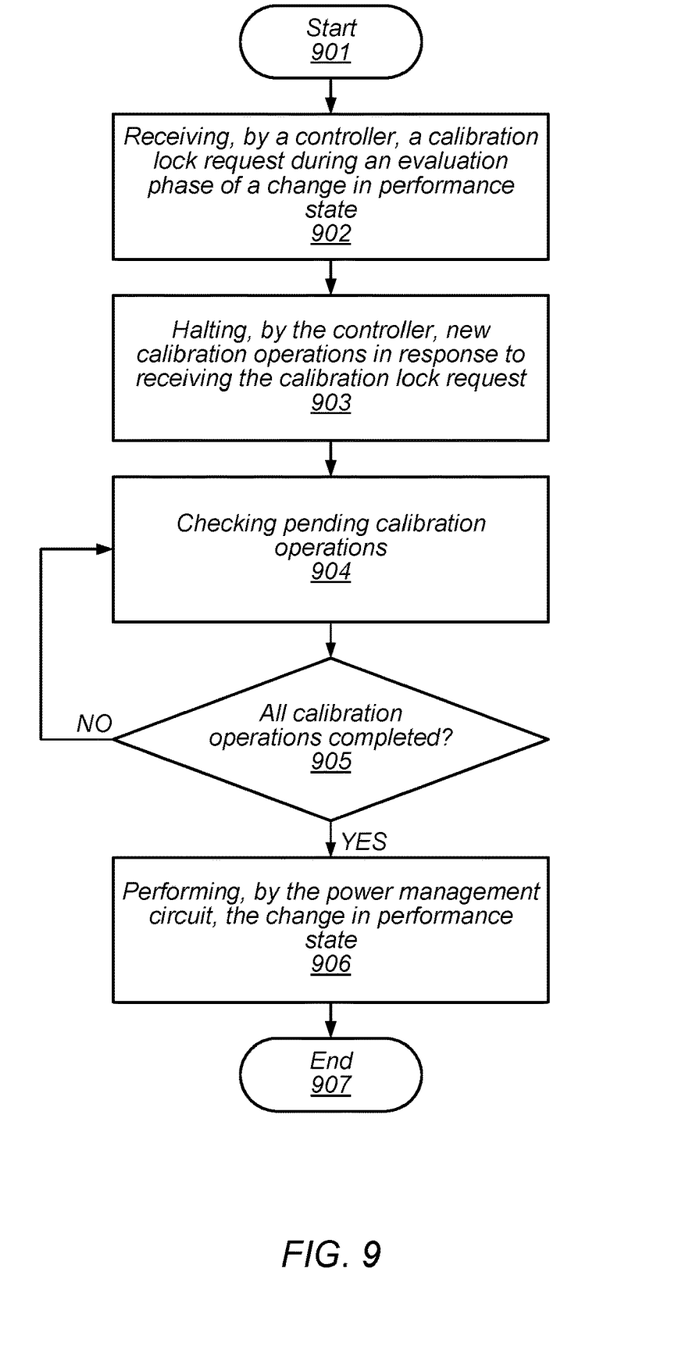
FIG. 9 illustrates a flow diagram depicting an embodiment of a method for using a calibration lock during a performance state change.

A controller may then receive calibration lock request signal during an evaluation phase of a change in performance state (block 902). During the evaluation phase, a system performance state change circuit, such as, e.g., system performance state logic circuit 202 may check bandwidth of memories included in the system.

The controller may then halt new calibration operations, in response to receiving the calibration lock request (block 903). In various embodiments, the controller may signal calibration operations to one or more memories based on an elapsed time since a last calibration, a change in power supply voltage, a change in operating frequency, and the like. Once a calibration lock request has been received, the controller will halt signaling memories to perform calibration operations even if conditions have been met that would otherwise initiate a calibration operation.

Pending calibration operations may then be checked (block 904). The controller may check pending calibration operations that are already in progress. As calibration operations that are in progress complete, a logic value corresponding to a particular memory that has completed the calibration operation may be changed. The method may then depend on a number of calibration operations that have completed (block 905).

If there are calibration operations in progress, then the method may continue from block 904, as described above. Alternatively, if all of the calibration operations have completed, a power management circuit, such as, e.g., power management circuit 101, may perform the requested change in performance state (bloc 906). Once the power management circuit has completed the change in performance state, the method may conclude in block 907.

Although the operations included in the embodiment of FIG. 9 are depicted as being performed in a serial fashion, in other embodiments, two or more of the operations may be performed in parallel.

Figure 10:
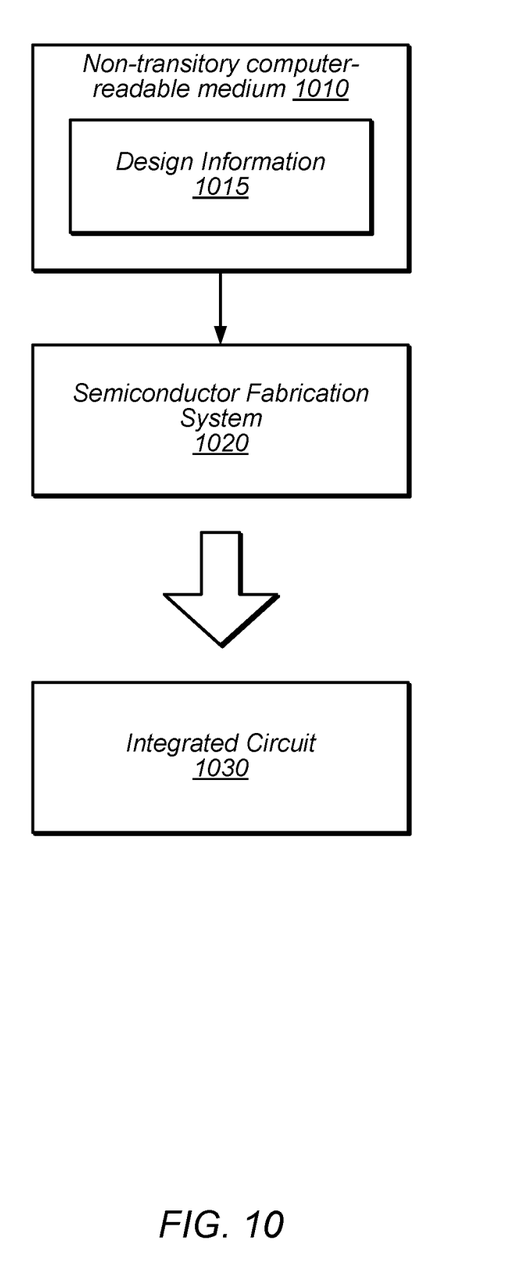
FIG. 10 illustrates a block diagram illustrating an embodiment of a computer-readable storage medium.

FIG. 10 is a block diagram illustrating an example non-transitory computer-readable storage medium that stores circuit design information, according to some embodiments. In the illustrated embodiment, semiconductor fabrication system 1020 is configured to process the design information 1015 stored on non-transitory computer-readable storage medium 1010 and fabricate integrated circuit 1030 based on the design information 1015.

Non-transitory computer-readable storage medium 1010, may comprise any of various appropriate types of memory devices or storage devices. Non-transitory computer-readable storage medium 1010 may be an installation medium, e.g., a CD-ROM, floppy disks, or tape device; a computer system memory or random-access memory such as DRAM, DDR RAM, SRAM, EDO RAM, LPDDRxx, HBMxx, widelOxx, Rambus RAM, etc.; a non-volatile memory such as a Flash, magnetic media, e.g., a hard drive, or optical storage; registers, or other similar types of memory elements, etc. Non-transitory computer-readable storage medium 1010 may include other types of non-transitory memory as well or combinations thereof. Non-transitory computer-readable storage medium 1010 may include two or more memory mediums, which may reside in different locations, e.g., in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. Design information 1015 may be usable by semiconductor fabrication system 1020 to fabricate at least a portion of integrated circuit 1030. The format of design information 1015 may be recognized by at least one semiconductor fabrication system, such as semiconductor fabrication system 1020, for example. In some embodiments, design information 1015 may include a netlist that specifies elements of a cell library, as well as their connectivity. One or more cell libraries used during logic synthesis of circuits included in integrated circuit 1030 may also be included in design information 1015. Such cell libraries may include information indicative of device or transistor level netlists, mask design data, characterization data, and the like, of cells included in the cell library.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 is configured to operate according to a circuit design specified by design information 1015, which may include performing any of the functionality described herein. For example, integrated circuit 1030 may include any of various elements shown or described herein. Further, integrated circuit 1030 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a plurality of memories;
   a controller coupled to the plurality of memories; and
   a power management circuit configured to:
   receive a request for a change to a first performance state for at least one memory of the plurality of memories;
   receive a request for a change to a second performance state for the at least one memory, wherein the request for the change to the second performance state is received after the request for the change to the first performance state;
   send a notification to the controller, in response to a determination that the change to the first performance state is in progress; and
   execute the change to the second performance state upon completion of the change to the first performance state; and
   wherein the controller is configured to halt scheduling of memory interface calibration operations for the at least one memory based on the notification.

2. The apparatus of claim 1, wherein the power management circuit is further configured to, in response to a determination that the change to the first performance state has not started, and that a supply voltage value of the first performance state is the same as the supply voltage value of the second performance state:
   merge the first performance state and the second performance state into a third performance state; and
   execute a change to the third performance state.

3. The apparatus of claim 1, wherein the power management circuit is further configured to, in response to a determination that the change to the first performance state is in progress, and that a supply voltage of the first performance state is the same as a supply voltage of the second performance state, serially execute the change to the first performance state and the change to the second performance state.

4. The apparatus of claim 1, wherein the controller is further configured to:
   start a timer, in response to a change from the first performance state; and
   send, in response to a return to the first performance state before the timer has expired, a message to the at least one memory indicating that the at least one memory use previous calibration results.

5. The apparatus of claim 1, wherein the controller is further configured to:
   in response to a temperature-based change in a voltage level of a power supply for the at least on memory, halt calibration and refresh operations for the at least one memory.

6. The apparatus of claim 1, wherein the controller is further configured to:
   receive a calibration lock request during an evaluation phase of a change in performance state; and
   in response to receiving the calibration lock request, halt new calibration operations for the plurality of memories.

7. A method, comprising:
   receiving, by a power management circuit, a request for a change to a first performance state for at least one memory of a plurality of memories;
   receiving, by the power management circuit, a request for a change to a second performance state for the at least one memory, wherein the request for the change to the second performance state is received after the request for the change to the first performance state;
   sending, by the power management circuit, in response to determining the change to the first performance state is in progress, a notification to a controller coupled to the plurality of memories;
   halting, by the controller, scheduling of memory interface calibration operation for the at least one memory based on the notification; and
   executing the change to the second performance state for the at least one memory upon completion of the change to the first performance state.

8. The method of claim 7, further comprising in response to determining the change to the first performance state has not started, and that a supply voltage value of the first performance state is the same as supply voltage value of the second performance state:
   merging the first performance state and the second performance state into a third performance state; and
   executing a change to the third performance state.

9. The method of claim 7, further comprising, in response to determining the change to the first performance state is in progress, and that a supply voltage value of the first performance state is the same as a supply voltage value of the second performance state, serially executing the change to the first performance state and the change to the second performance state.

10. The method of claim 7, further comprising:
    starting, by the controller, a timer, in response to a change from the first performance state; and
    sending, by the controller, in response to a return to the first performance state before the timer expires, a message to the at least one memory indicating that the at least one memory use previous calibration results.

11. The method of claim 7, further comprising, in response to a temperature-based change in a voltage level of a power supply for the at least on memory, halting calibration and refresh operations for the at least one memory.

12. The method of claim 7, further comprising:
    receiving, by the controller, a calibration lock request during an evaluation phase of a change in performance state; and
    in response to receiving the calibration lock request, halting, by the controller, new calibration operations for the plurality of memories.

13. The method of claim 12, further comprising performing, by the power management circuit, the change in performance state, in response to determining each memory of the plurality of memories has completed pending calibration operations.

14. A non-transitory computer-readable storage medium having design information stored thereon, wherein the design information specifies a design of at least a portion of a hardware integrated circuit in a format recognized by a semiconductor fabrication system that is configured to use the design information to produce the hardware integrated circuit according to the design information, wherein the design information specifies that the hardware integrated circuit comprises:
   a plurality of memories;
   a controller coupled to the plurality of memories; and
   a power management circuit configured to:
      receive a request for a change to a first performance state for at least one memory of the plurality of memories;
      receive a request for a change to a second performance state for the at least one memory, wherein the request for the change to the second performance state is received after the request for the change to the first performance state;
      send a notification to the controller, in response to a determination that the change to the first performance state is in progress; and
      execute the change to the second performance state upon completion of the change to the first performance state; and
   wherein the controller is configured to halt scheduling of memory interface calibration operations for the at least one memory based on the notification.

15. The non-transitory computer-readable storage medium of claim 14, wherein the power management circuit is further configured to, in response to a determination that the change to the first performance state has not started, and that a supply voltage value of the first performance state is the same as the supply voltage value of the second performance state:
    merge the first performance state and the second performance state into a third performance state; and
    execute a change to the third performance state.

16. The non-transitory computer-readable storage medium of claim 14, wherein the power management circuit is further configured to, in response to a determination that the change to the first performance state is in progress, and that a supply voltage of the first performance state is the same as a supply voltage of the second performance state, serially execute the change to the first performance state and the change to the second performance state.

17. The non-transitory computer-readable storage medium of claim 14, wherein the controller is further configured to:
    start a timer, in response to a change from the first performance state; and
    send, in response to a return to the first performance state before the timer has expired, a message to the at least one memory indicating that the at least one memory use previous calibration results.

18. The non-transitory computer-readable storage medium of claim 14, wherein the controller is further configured to, in response to a temperature-based change in a voltage level of a power supply for the at least on memory, halt calibration and refresh operations for the at least one memory.

19. The non-transitory computer-readable storage medium of claim 14, wherein the controller is further configured to:
    receive a calibration lock request during an evaluation phase of a change in performance state; and
    in response to receiving the calibration lock request, halt new calibration operations for the plurality of memories.

20. The non-transitory computer-readable storage medium of claim 19, wherein the power management circuit is further configured to perform the change in performance state, in response to determining each memory of the plurality of memories has completed pending calibration operations.

* * * * *